United States Patent [19]

Miller

[11] 4,249,070
[45] Feb. 3, 1981

[54] COUNTER/TIMER WITH INCREMENTAL INDICATORS

[75] Inventor: David D. Miller, Blue Grass, Iowa

[73] Assignee: Gulf & Western Manufacturing Company, New York, N.Y.

[21] Appl. No.: 947,200

[22] Filed: Sep. 29, 1978

[51] Int. Cl.³ .............................................. G06M 3/02
[52] U.S. Cl. .............................. 235/92 T; 235/92 PE; 235/92 EA
[58] Field of Search ........... 235/92 EA, 92 PE, 92 T, 235/92 DM, 92 FQ; 328/48; 58/23 R

[56] References Cited

U.S. PATENT DOCUMENTS

| | | | |
|---|---|---|---|
| 3,684,870 | 8/1972 | Nelson | 235/92 EA |
| 3,754,121 | 8/1973 | Delay et al. | 235/92 EA |
| 3,885,134 | 5/1975 | Bergin et al. | 235/92 DM |
| 4,014,011 | 3/1977 | Ashkin | 235/92 EA |

FOREIGN PATENT DOCUMENTS 2608683  8/1977  Fed. Rep. of Germany.

Primary Examiner—Joseph M. Thesz
Attorney, Agent, or Firm—Meyer, Tilberry & Body

[57] ABSTRACT

In a timer or counter for timing to a selected time or counting to a selected count, there is included digital counting means and means for creating an output signal when the counting means counts to a selected number. In this type of device, there is further provided a plurality of two state indicator elements and means responsive to the counting means for changing the state of one of the elements after the timer or counter has progressed through each of several, preselected portions of the selected number being counted.

5 Claims, 6 Drawing Figures

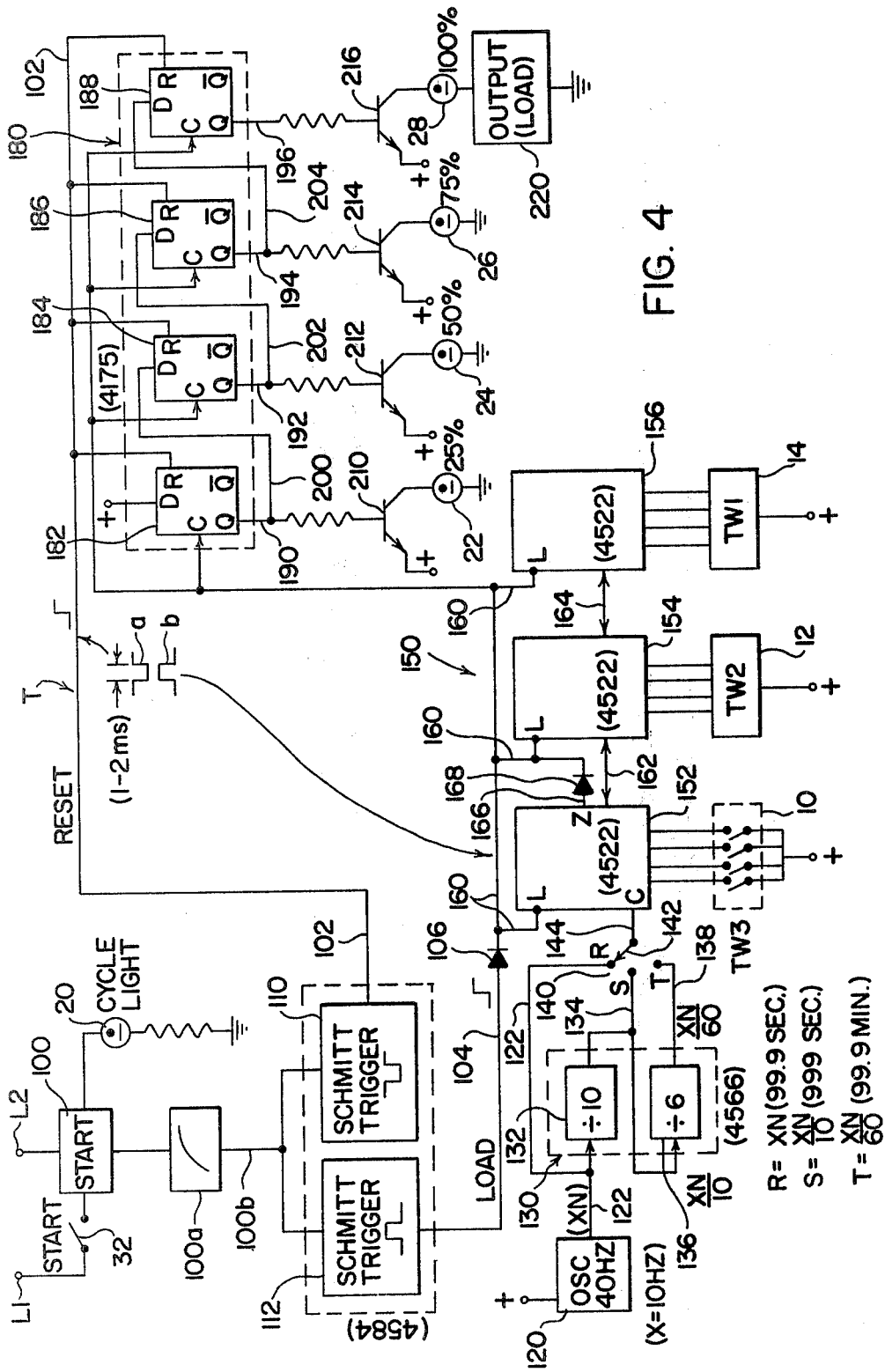

COUNTER/TIMER WITH INCREMENTAL INDICATORS

BACKGROUND OF INVENTION

The invention relates to the art of digital counting and more particularly to a counter/timer having incremental indicators.

The invention is particularly applicable for use as a timer and it will be described with reference thereto; however, it is appreciated that the invention relates generally to a digital counting device which may be used both as a counter and a timer.

In controlling processes and machines, there has been developed a wide range of counters and timers which control various functions. These counters or timers generally include an arrangement for changing the counts or time which constitute a complete cycle. Until the last decade or so, these counters or timers were motor driven electromechanical devices which generally included a dial having a first pointer which could be adjusted to the desired time or count, known as the set point, and a second pointer which progressed toward the set point pointer. Consequently, visual inspection easily indicated the progress of a timer or counter as it was being cycled. The spacing of the movable or progress pointer with respect to the set point pointer indicated the amount of the cycle which had expired or, conversely, the amount of the cycle which was remaining. This information is often valuable for an operator monitoring the process or machine being controlled by the timer or counter. With the advent of solid state devices, such as the MOS and CMOS technology, many of the industrial counters and timers have been converted to digital devices using solid state counting circuits. In these devices, thumbwheel units were often provided to set the desired cycle or set point. The thumbwheel units would include visible digits which would indicate to the operator the cycle being counted or timed. Often by the use of display devices, such as 7-Bar indicators, the progress of the solid state timer toward the set point of the thumbwheel units was made visually available to an operator. In such devices, thumbwheel units would indicate the preselected cycle and a readout or display device would display the current condition of the device. The use of a display device presented some difficulty. The operator had to compare mentally the readout or display device with the thumbwheel setting to determine the progress of the counter or timer through its preselected cycle.

In order to render the timer or counter less expensive, the digital decoder circuits and the display devices associated therewith were sometimes eliminated so that only the thumbwheel settings were visible. A light on the digital device would indicate that the device was cycled. In this type of device, there was no manner for the operator to determine the portion of the cycle which had expired or which remained. Consequently, there was some sales resistance to the removal of the decoders and readout devices for counters or timers. It was found that the decoder and display arrangement for the counter or timer contributed substantially to the total cost of the device. For that reason, there is a substantial demand for a counter or timer which will indicate the progression of a digital counter or timer through its cycle without the expense concomitant with the previously used digital decoders and display devices or units.

THE INVENTION

The present invention relates to an improvement in a digital counter or timer device which improvement involves a structure which allows the operator to observe the general progression of a counter or timer through its preselected cycle. The present invention accomplishes this function without the necessity of complex and costly digital decoding circuits. In summary, the present invention relates to an improved digital timer or counter which exhibits the progression through a preselected cycle without use of complex digital display circuitry. In this manner, the unit can be manufactured for cost approaching the previously manufactured devices which have no display unit and still give intelligence to the operator regarding a progression of the counter or timer through the preselected cycle.

In accordance with the present invention there is provided an improvement in a digital, solid state counter for counting to a selected number, which counter includes a digital counting means for counting incoming pulses and means for creating an output signal when the counting means counts the incoming pulses to the preselected number. The improvement comprises a plurality of two state indicator elements and means responsive to the counting means for charging the state of one of the elements after the counter has progressed through each of several, preselected portions of the selected number. In practice, these portions are equal.

Of course, a digital counter of this type is a generic device which is used as a timer when the incoming pulses are equally spaced on a time base. In other words, a fixed frequency for incoming pulses will convert the digital counter device to a timing mode of operation for timing a preselected cycle.

In accordance with still a further aspect of the present invention, there is provided a timer for timing to an adjustable preselected time, this timer includes means for creating timing pulses at a counting rate N times the rate necessary to obtain a given number of the pulses in the preselected time; counter means for counting the given number in repeating succession, this counter means includes means for creating a signal upon successive counting to the given number; means for counting these signals; and, means responsive to the signal counting means for creating an output signal when N signals are counted. N is an integer, which in the preferred embodiment is 4.

The primary object of the present invention is the provision of a digital counter/timer device, which device provides a visual display of the general progress of a cycle being processed.

Another object of the present invention is the provision of a digital counter/timer device, as defined above, which device operates without decoding, display and other complex digital circuitry.

Yet another object of the present invention is the provision of a device as defined above, which device provides indicator elements, such as lights, to illustrate the progression of the unit through a processing cycle.

Yet another object of the present invention is the provision of a device, as defined above, which device uses the concept of two counters one of which counts to the cycle set point at an increased rate and the other of which counts the times to which the first counter counts to the cycle set point.

Still a further object of the present invention is the provision of a device, as defined above, which device has no moving parts to display the progress of a counting or timing cycle.

Yet a further object of the present invention is the provision of a device, as defined above, which device illustrates visually the progress of a cycle being processed by the counter and timer without requiring mental calculations.

Still a further object of the present invention is the provision of a device, as defined above, which device is useful for both short and long times or counts and which is readable at a substantial distance.

These and other objects and advantages of the present invention will become apparent from the following description.

BRIEF DESCRIPTION OF DRAWINGS

In the description of the preferred embodiment, the following drawings are set forth.

PREFERRED EMBODIMENT

Figure 1:
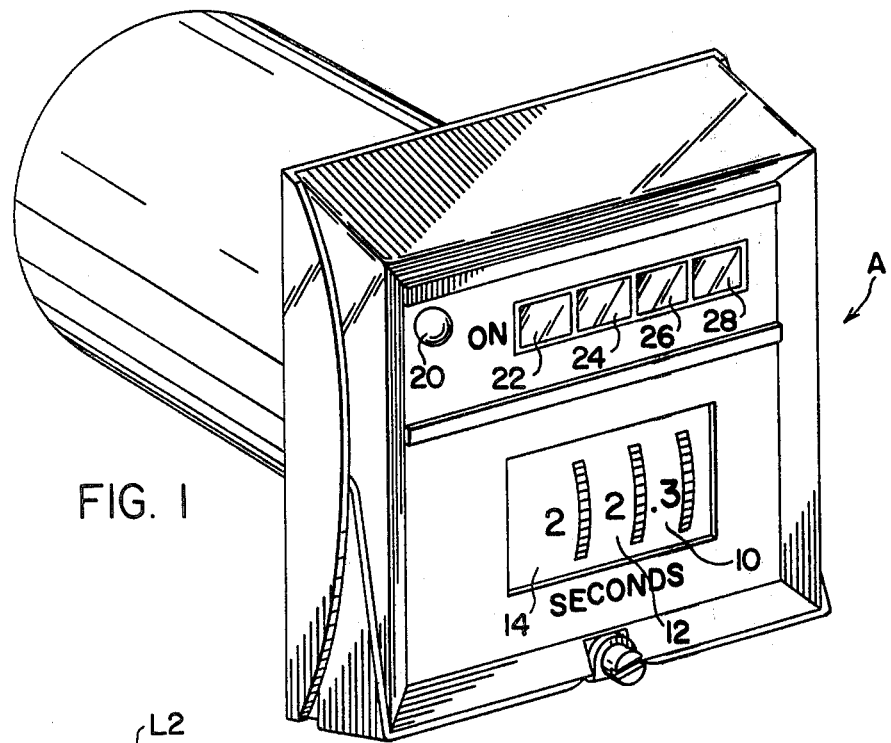
FIG. 1 is a pictorial view of the digital counter/timer device embodying the preferred embodiment of the present invention.

Referring now to FIG. 1, digital timer A constructed in accordance with the present invention includes thumbwheel units, three of which are used in the preferred embodiment and are shown as units 10, 12 and 14. Each thumbwheel unit displays the manually selected numeral as indicated. By adjusting the thumbwheels, the scale of the timer A is changed. The illustrated scale is 99.9 seconds. As is well known, the thumbwheel unit for a digital counter or timer includes a group of switches which are actuated to give a binary coded decimal (BCD) output corresponding to the selected position of the unit. Also displayed on the face of timer A is an ON light 20 and progression indicator elements, shown as lights 22, 24, 26 and 28. In operation, the thumbwheel units 10-14 are manually adjusted to the desired timing cycle for timer A. An input pulse or signal starts or actuates digital timer A in accordance with standard technology. After a cycle is started, light 20 is illuminated and timer A starts timing toward the set point illustrated as the numerals appearing on the thumbwheel devices. In this instance, the set point or timing cycle is 22.3 seconds. After 25% of the cycle has been processed, light 22 is illuminated. After 50% of the cycle, light 24 is illuminated. In a like manner, light 26 is illuminated after 75% of the cycle has been processed. After the complete timing cycle, in this instance 22.3 seconds, has been processed 100%, light 28 is illuminated. In the preferred embodiment of the invention, all lights are illuminated after the preselected timing cycle has been processed. Thereafter, an appropriate reset can be employed to reset timer A for the next cycle or the timer can be reset automatically upon the next incoming starting signal or pulse. As can be seen, the number of lights which are illuminated indicates the progression of timer A through the timing cycle or set point manually selected by appropriate rotation of thumbwheel units 10-14.

Figure 2:
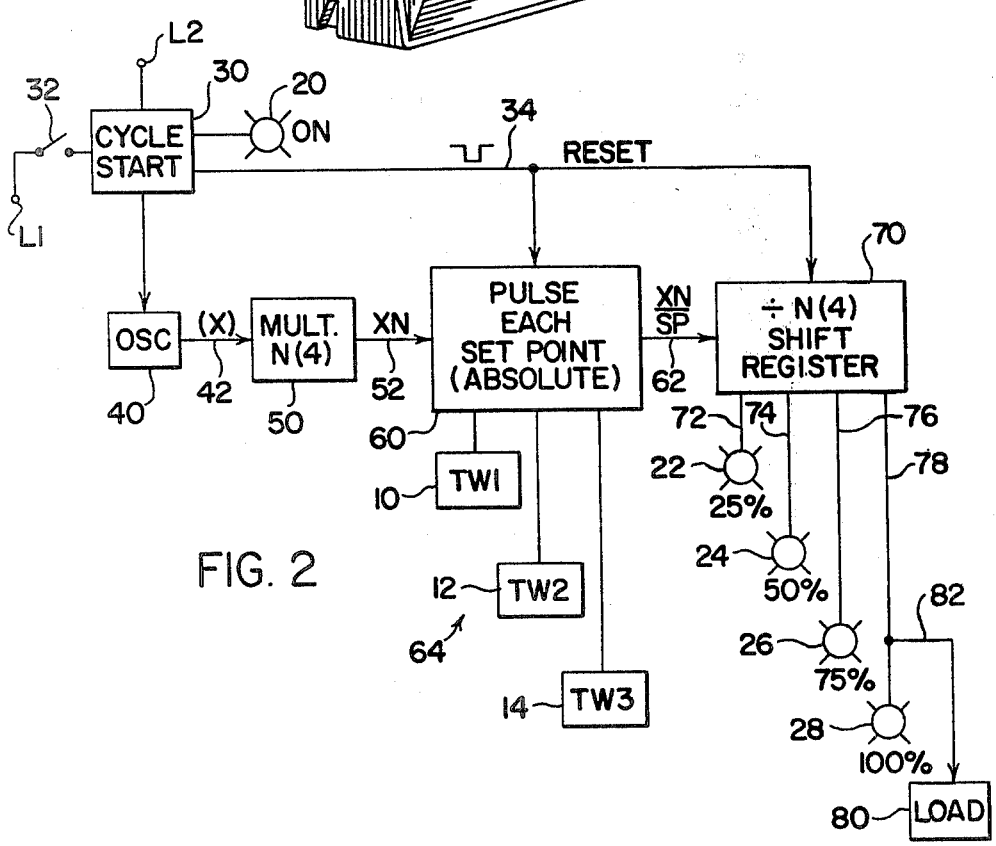
FIG. 2 is a simplified block diagram illustrating the operating characteristics of the preferred embodiment of the invention.

Referring now to FIG. 2, a simplified, conceptual block diagram of the preferred embodiment of the present invention shown in FIG. 1 is illustrated. A starting circuit or network 30 is connected across power lines L1, L2 to accept an appropriate signal for starting the cycle. In the illustrated embodiment, for simplicity, the cycle is started by closing switch 32. Of course, various other input starting signals could be used for initiating the timing cycle. When the timer is started for timing a cycle, reset line 34 receives a pulse from starting circuit 30 to reset the counting circuitry of timer A. This shifts lights 22-28 into the non-illuminated or deactivated condition or state in a manner to be explained later. In this illustrated embodiment, an oscillator 40 creates output pulses in line 42. This oscillator can be free-running or can be energized upon the start of a cycle, according to the procedure desired. Pulses in line 42 are created at a frequency determined by the fixed frequency (X) of oscillator 40. The equally spaced pulses are directed to the input of a digital multiplying circuit 50. The multiple of circuit 50 is an integer N which corresponds to the number of lights used to record the cycle process. In the illustrated embodiment, N is 4. Output line 52 of multiplying circuit 50 has a fixed frequency increased by the multiple N. The pulse train in line 52 is directed to the input of a standard pulse down counter 60 which has an adjusted initial counting position determined by the setting of thumbwheel units TW1-TW3, which are units 10-14, respectively. These units are shown in a network 64. This setting is the desired time and is loaded into down counter 60. Counter 60 then counts to the set point amount at a rate (4X) which is increased over the oscillator rate by the integer N, i.e. 4. Thus, counter 60 is down counted at a rate four times greater than the oscillator rate or frequency. Of course, in practice the oscillator could have a frequency of XN wherein X is the frequency for counting to the set point in the set point time and N is the integer used to divide the cycle into indicating intervals. When the adjusted set point is reached, a signal is created in output line 62 of counter 60. One of these signals occurs each time counter 60 reaches the set point determined by the thumbwheel setting. The counting rate of signals in line 62 can be represented mathematically as XN/SP. In the schematic illustration of FIG. 2, the frequency or rate of the pulse train in line 42 is the rate at which the counter 60 would reach its set point within the actual time appearing on thumbwheel units 10-14. By counting this counter at a rate which is N times greater, N signals are received in line 62 during the time set into the thumbwheel units. By counting counter 60 at a rate four times greater than the desired counting rate of a normal counter, four signals are received as the pulse counter 60 counts to the set point reloads the set point and counts to the set point repeatedly until the set time has expired. These four signals are directed by line 62 to counter 70 in the form of a shift register having output lines 72-78 connected to each of the stages of the shift register. As will be explained later, the shift register is of the type which progressively shifts a logic condition through the register while retaining the logic on prior stages. Lines 72-78 control lights 22-28 so that the lights are progressively lighted with a time spacing between the lights of 1/N of the set point time. An output load 80 is energized when light 28 is illuminated by line 82 connected to the 100% line 78. Thus, lights 22-28 are progressively lighted in increments as counter or shift register 70 counts the incoming signals on line 62. Each of these signals is a pulse and represents equally divided portions of the total set point time.

Figure 3:
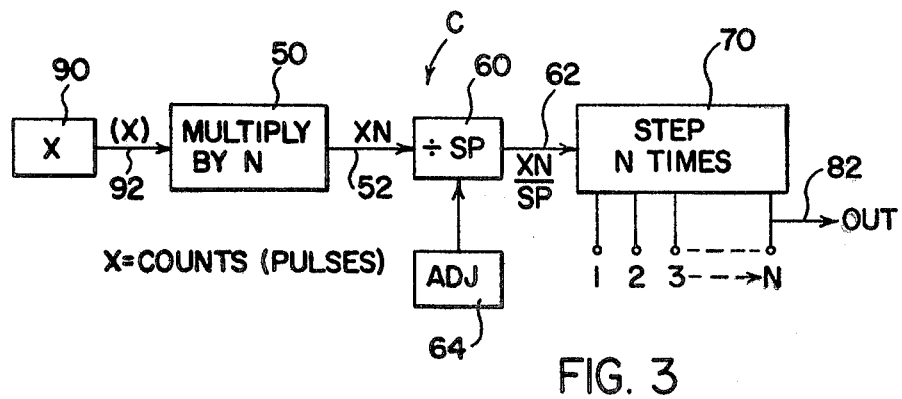
FIG. 3 is a simplified block diagram illustrating operating characteristics of the preferred embodiment of the invention.
Figure 3A:
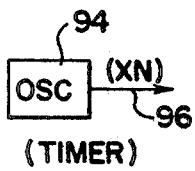
FIG. 3A is a partial block diagram showing a modification of the block diagram of FIG. 3 for converting the illustrated system to a timing mode.

Referring now to FIG. 3, the system shown in FIG. 2 is modified somewhat and is shown for use as a counter C. In this instance, a counting circuit 90 creates pulses in line 92 which are indicative of the counts being counted by counter or unit C constructed in accordance with the invention. Thus, pulses appearing in line 92 have an occurrence rate indicated by (X) and which is not a time base rate. A multiplying circuit 50 multiplies each incoming pulse to be counted to produce in line 52 XN pulses. Consequently N times the number of incoming pulses are directed to counter 60 as previously described to produce an output signal in line 62 as the count number selected by the adjusting network 64 is reached. Thus, a signal or pulse is created in line 62 each time the incoming pulses reach the set point divided by N. The signals in line 62 are then directed toward counter 70 which has N stages. In the preferred embodiment N is the integer 4. However, it could be other integers, thus producing incremental progression of the lights or other indicating elements through the total counting cycle. To shift the schematically represented concept of FIG. 3 into a timing mode, oscillator 94 having an output pulse train with a frequency XN in output line 96, as shown in FIG. 3A, could be directed to the input of counter 60 shown in FIG. 3. This would convert the schematic illustrated counter C of FIG. 3 into a timer. As can be seen, there is provided a set point counter 60 which is adjusted to a desired set point. If the normal or standard pulse of a fixed frequency or random counts were directed to counter 60, it would reach the count out position at the selected time or count adjusted manually by circuit 64. Counter 60 is a standard cascade connected digital counter having three stages and an arangement for reloading the counter when the set point is reached. This counter is counted or decremented at a rate which is greater than the normal rate to reach the desired count or time. The increase in the counting rate is represented by the integer N so that the output of counter 60 is a series of signals created at equal portions of the actual set point. When the number of signals reaches the integer N, the time or count cycle has expired. Thus, the shift register or other stepping or counting device 70 has stages which correspond with the integer used in the particular embodiment. The indicator elements 22-28 are progressively actuated in equal time or count increments until the total counting or timing cycle has expired. Of course, various modifications could be made in the concept of counting the basic counter circuit 60 of the timer or counter at an increased rate to produce signals which will progressively actuate indicator elements through a timing or counting cycle.

Referring now to FIG. 4, the preferred embodiment of the invention is illustrated wherein the invention is used in a timing mode. In this preferred embodiment, timer T includes the thumbwheel units 10-14 and indicator lights 22-28, as previously described. An appropriate starting device, such as switch 32 as previously described, produces an input pulse or a continuous input voltage level to a starting network 100. In the illustrated embodiment, a continuous input voltage level is applied to the network across lines L1, L2. Network 100 produces a time constant curve, schematically represented by block 100a, in line 100b directed to the inputs of two Schmitt triggers 110, 112 of the type provided on a Hex Schmitt trigger CMOS chip 4584. Thus, when a timing cycle is to be started, an input to network 100 causes a changing voltage to be applied to the two Schmitt triggers. The first Schmitt trigger 110 produces a pulse a which is a negative going pulse having an appropriate width such as approximately 1-2 ms. In a like manner, Schmitt trigger 112 produces a positive going pulse b having the same width as pulse a. These pulses appear in lines 102, 104, respectively. The circuitry of timer T actuates on the positive going edge of trigger pulses a, b; therefore, there is first provided a leading edge in LOAD line 104 and then a leading edge in RESET line 102. Of course, trigger pulses a, b could be spaced from each other or other arrangements could be provided for first creating an actuating signal in LOAD line 104 and then an actuating signal immediately thereafter in RESET line 102. The circuit so far described creates this type of correlation between the LOAD trigger and the RESET trigger. Diode 106 isolates the trigger 112 from the circuit it controls. The remainder of the circuit as shown in FIG. 4 operates in accordance with the previously discussed concepts of the present invention. In this preferred embodiment, an oscillator 120 produces an output pulse train having a fixed frequency (XN) which is N times a normal time base frequency (X). In this embodiment, a normal counting frequency for use in timer T would be 10 Hertz. Thus, oscillator 120 produces a 40 Hertz timing pulse train in line 122. In the preferred embodiment, four stages are provided to successively light indicator lights 22-28. Thus, the frequency in line 122 is four times the normal frequency to be used for counting to a set point selected in thumbwheel units 10-14. In the illustrated embodiment, the pulses in line 122 are directed to the input of a multiple dividing circuit 130 of the type provided on a 4566 CMOS chip and to a switch terminal R. By directing the input pulse train on line 122 to the input of the divide by 10 circuit 132, the frequency in output line 134 is 1/10 of the frequency in input line 122. This output is connected to a switch terminal S. Output line 134 is connected to a second dividing circuit 136 which divides the pulse train in line 134 by the integer 6. This produces a frequency in output line 138 having a frequency of 1/60 of the input frequency in line 122. This output line is connected to a switch terminal T. The terminals R, S and T form input terminals of a selector switch 140 having a manually movable pointer 142, which can be shifted selectively between terminals R, S and T. In this manner, output line 144 of selector switch 140 can receive pulses from line 122, 134 or 136, respectively. Timer T can thus be switched between the ranges of 99.9 seconds, 999 seconds and 99.9 minutes. Of course, a divider circuit could be provided which would allow selection by a selector switch for other ranges of timer T taking into consideration the frequency of pulses in line 122.

In the preferred embodiment of the invention, a cascade connected down counter 150 having stages 152, 154 and 156, corresponding to the number of thumbwheel units is used to down count from the BCD information loaded from the thumbwheel units. The down counter stages 152–156 could be formed from several available digital units; however, in practice they are each down counting CMOS chips 4522. As illustrated, the chips include standard down counting terminals C and loading terminals L. The BCD information of the thumbwheel units is loaded into the respective stages 152–156 upon receipt of a positive going signal at load terminal L. Even though all chips include a zero output Z only the zero output terminal of chip or stage 152 is shown. This terminal is connected to an output line 166. Also, the counting terminals of stages 154 and 156 are not illustrated for the purposes of simplicity. The respective chips are cascaded by appropriate lines 162, 164 in standard cascade modes for cascade down counters. An isolating diode 168 connects line 166 of the zero output terminal for chip 152 with the load lines 160 of all chips or stages 152–156. This load line is isolated from the input load 104 by diode 106. Down counter 150 operates in accordance with standard digital counter practice. As counting pulses are received from line 144 the BCD set point load from the thumbwheel units is down counted to a zero condition in all stages. At that time, a pulse appears in the zero output terminal Z of chip 152. This pulse reloads the BCD set point back into all chips or stages of counter 150 for another down counting cycle controlled by the setting of thumbwheel units 10–14. In standard down counting devices, a pulse in line 166 indicates that the timing cycle has been completed and the output is set by this pulse or signal. In accordance with the present invention, there is provided a quad storage register 180 similar to a shift register and of the type provided on a standard CMOS chip 4175. Register 180 includes stages 182–188 schematically illustrated as D flip-flops. These stages each include standard terminals C, D, R, Q and $\overline{Q}$. In the circuitry shown in FIG. 4, the Q output terminals of stages 182–188 are connected to output lines 190–196, respectively. The stages are interconnected by lines 200, 202 and 204 extending between the Q output terminal of a prior stage to a D terminal of the successive stage. The D terminal of the first stage 182 is connected to a logic 1 source. In general operation of register 180, as a pulse is received in load line 160 down counter 150 is reloaded with the BCD set point. At the same time, a signal or pulse is received by the first stage 182 of register 180. This signal clocks the D logic to the Q output. Consequently, upon receipt of the first signal in line 160, line 190 is shifted to logic 1. The next signal shifts line 192 to a logic 1. The third signal shifts line 194 to a logic 1. The fourth signal in line 160 shifts output line 196 of stage 188 to a logic 1. This energizes light 28 and activates output load 220 which is generally the coil of a relay which closes contacts indicating the end of a timing cycle corresponding to the set point manually adjusted by units 10–14. As can be seen, since counter 150 is counted at 4 times the standard rate to provide a signal in the output of the counter after the expiration of the time corresponding to the set point time, four signals are received by line 160 before the actual set point time has been reached. These pulses progressively actuate the indicator elements or lights 22–28. The first signal actuates light 22 which indicates 25% expiration of the timing cycle. The second light 24 indicates 50% expiration of the timing cycle. Light 26 is actuated after 75% of the timing cycle has expired. Light 28 is actuated at the end of the timing cycle and actuates output load 220. Of course, a standard shift register of the type progressing the logic 1 through the stages could be used. In this instance, only one light would be energized at any given time, which light would indicate the percentage of progression through the timing cycle in increments of 25%. Register 180 in essence counts the signals in line 160 until N signals are received to set the output. Transistors 210–216 are used as gates or switches for lights 22–28, respectively; however, other actuating devices could be used.

In operation, a starting signal at switch 32 first loads counter 150 with a BCD set point from units 10–14 by creating a pulse in line 140. This pulse is transmitted to the load line 160 through diode 106. Such a pulse will actuate stage 182 of register 180. However, a reset pulse in line 102 immediately follows the starting signal and resets all stages 182–188 of register 180 to a logic 0. Thus, no lights are energized at the start of the cycle. When the down counter 150 counts to the BCD set point at the increased rate of XN, a signal in line 160 steps the counter or register 180.

Figure 4A:
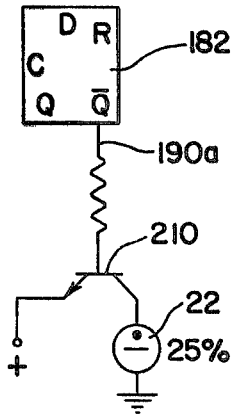
FIG. 4 is a combined wiring and block diagram illustrating the preferred embodiment of the present invention used in the timing mode; and, FIG. 4A is a wiring and block diagram showing a modification which can be employed in the preferred embodiment of the invention as shown in FIG. 4.

If a larger number of lights are required to divide the timing cycle of timer T into a greater number of equal increments or portions, the rate of pulses in line 144 is increased by the integer corresponding with the output lights or stages. Thus, further pulses are received in equal portions of the timing cycle to actuate the number of lights in the output register or output counter 180. FIG. 4A illustrates a slight modification in the preferred embodiment of the invention as shown in FIG. 4. In this instance, the lights are controlled by the $\overline{Q}$ terminals such as the $\overline{Q}$ terminal of stage 182 shown in FIG. 4A. This terminal is connected to output line 190a which will actuate the 25% light 22 until the first signal is received. At that time, the first stage will toggle to turn the light OFF. If the remainder of the stages are connected in the same manner as shown in FIG. 4A, all lights are ON after the reset pulse. Thereafter, the successive lights are turned off by signals in line 160. In this manner, the lights 22–28 indicate the remaining portion of the timing cycle. The preferred embodiment of the invention as shown in FIG. 4 could be converted to a counter by applying four pulses to line 144 upon the receipt of each counting pulse. In that instance, the thumbwheel units would be adjusted to the count and selector switch 140 would not be used.

Having thus described the invention, it is claimed:

1. A timer for timing to an adjustable selected time, said timer including means for creating timing pulses at a counting rate N times the rate necessary to obtain a given number of said pulses in said selected time, said given number being a digital representation of said selected time; changeable counter means for counting to said digital representation of said selected time in repeating succession, said counter means including means for creating a signal upon each successive counting to said digital representation; means for counting said successive counting signals; means responsive to said signal counting means for creating an output signal when N successive signals are counted; manual display means for directly changing said digital representation to change the lapsed time before said output signal; a plurality of two state indicator elements and means for changing the state of one of said elements upon creation of each of said signals.

2. A timer as defined in claim 1 wherein said elements are lights and said two states are ON and OFF.

3. A timer as defined in claim 2 including means for changing said counting rate whereby the scale of said timer is changed.

4. A timer as defined in claim 1 including means for changing said counting rate whereby the scale of said timer is changed.

5. A timer as defined in claim 1 wherein said counter means is a multi-state cascade digital counter and said changing means includes means for changing the setting of said stages.

* * * * *